United States Patent [19]

Matsukawa

[11] Patent Number: 4,835,591
[45] Date of Patent: May 30, 1989

[54] WIRING ARRANGEMENT FOR SEMICONDUCTOR DEVICES

[75] Inventor: Takayuki Matsukawa, Itami, Japan

[73] Assignee: Mitsubishi Denki Kabushiki Kaisha, Japan

[21] Appl. No.: 138,949

[22] Filed: Dec. 29, 1987

[51] Int. Cl.$^4$ ...................... H01L 23/48; H01L 23/54
[52] U.S. Cl. ...................................... 357/68; 357/71; 357/67
[58] Field of Search ...................... 357/68, 71, 67, 51, 357/55

[56] References Cited

U.S. PATENT DOCUMENTS

| 4,525,733 | 6/1985 | Losee | 357/68 |
| 4,654,692 | 3/1987 | Sukurai et al. | 357/68 |

FOREIGN PATENT DOCUMENTS

| 0072349 | 5/1982 | Japan | 357/68 |
| 57-207353 | 12/1982 | Japan | |
| 0089437 | 5/1984 | Japan | 357/71 |
| 0049649 | 3/1985 | Japan | 357/71 |

OTHER PUBLICATIONS

"Elimination of Shorts Between Metallization Lines'—Geldermans—IBM Technical Disclosure Bulletin—vol. 26—No. 5—Oct. 1983—p. 2350.

Spinks, "Introduction to Integrated-Circuit Layout",- Prentice-Hall, 1985.

Dingwall et al, "An 8 MHz 8b CMOS Subranging ADC", 1985 IEEE International Solid-State Circuits Conference.

*Primary Examiner*—Andrew J. James
*Assistant Examiner*—Sheila V. Clark
*Attorney, Agent, or Firm*—Leydig, Voit & Mayer

[57] ABSTRACT

A semiconductor integrated circuit with a wiring arrangement for high integration density. The arrangement is dispersed on a semiconductor substrate with a first wiring portion formed on the substrate and a second wiring portion formed on the substrate at a location adjacent to one edge of the first wiring portion. The first wiring portion has a groove or a plurality of indentations formed therein, preferably in the vicinity of the edge thereof that is closer to the second wiring portion, for preventing short-circuiting between the first and second wiring portions through parts of the edge of the first wiring portion which have expanded during a heat treatment.

15 Claims, 5 Drawing Sheets

WIRING ARRANGEMENT FOR SEMICONDUCTOR DEVICES

BACKGROUND OF THE INVENTION

The present invention relates to a wiring layer of an aluminum alloy for high density integrated circuits.

FIG. 8 is a fragmentary plan view of a conventional semiconductor device according to "*Electronic Integrated Circuits,* J. Allison, McGraw-Hill, 1975, Chapter 1". FIG. 9 is a sectional view taken along the line A—A shown in FIG. 8. In these figures, the semiconductor device has a semiconductor substrate 1, circuit elements (none of which are shown), such as transistors, capacitors and resistors, which are formed on the substrate 1, an insulating film 2 formed over these circuit elements in such a manner as to cover them, and wiring portions 3 to 5 of an aluminum alloy which are formed on the insulating film 2. The wiring portion 3 acts as a power line or ground line, while the wiring portions 4 and 5 act as lines enabling connections for other purposes.

The semiconductor device constructed as described above is manufactured in the following manner. Circuit elements, such as transistors, capacitors and resistors (not shown), which are required for the circuit construction are first formed on the substrate 1. Thereafter, the insulating film 2 which provides the foundation for the wiring is formed over these elements. Subsequently, contact holes (none of which are shown) are formed in the insulating film 2 at locations thereof corresponding to those of terminals and electrodes of the elements which are to be connected to a wiring layer that will be formed in the following process. The wiring layer, which is formed of an aluminum alloy, is then formed on the entire upper surface of the insulating film 2 to a thickness of 0.5 to 1.5 $\mu$m. Finally, this wiring layer is patterned into a predetermined planar configuration by a photolithography method, thereby obtaining the wiring portions 3 to 5 shown in FIGS. 8 and 9.

With such a semiconductor device, the width of each wiring portion and the space between two adjacent ones are very important factors which determine the integration density of the circuit concerned, these wiring portions being formed of an aluminum alloy. Accordingly, various attempts have been made to reduce the width of the wiring portions and also the space between two adjacent wiring portions, so as to improve the integration density of the circuit concerned. As a result, it has become possible to form a wiring pattern wherein the width of a wiring portion and the space between two adjacent wiring portions may each be 2 $\mu$m or less.

It should be noted that, with respect to a wiring portion which is used as a power line or ground line and through which current of a large magnitude flows, it is necessary for the wiring portion to have a width of at least about 5 $\mu$m. This is to avoid the physical phenomenon known as "electro-migration" in which, when current of a high density flows through a wiring portion, atoms of the metal forming the wiring move. In general, it is known that, in aluminum wiring, when the current density exceeds $1 \times 10^5$ A/cm$^2$, such a phenomenon will occur. For this reason, the wiring portion 3 which acts as a power line or ground line is made wider than the other wiring portions 4 or 5, as shown in FIGS. 8 and 9.

However, when wiring portion 3 is formed of an aluminum alloy, hillocks or projections 3a, as shown in FIGS. 8 and 9, may be formed at edges of the wiring portion 3. Projections 3a may be formed when the semiconductor device is subjected to a heat treatment such as annealing. The metal material forming the wiring portion 3 may be softened and partially displaced during the heat treatment. It has been confirmed in certain experiments conducted by the present inventors that these hillocks 3a are often formed on the edges of a wide wiring portion which has, as the wiring portion 3 does, a width of 5 $\mu$m or more. Hillocks are rarely formed on a narrow wiring portion having, as the wiring portions 4 and 5 do, a width of 2 $\mu$m or less. It has also been confirmed that a hillock may sometimes have a length (i.e., a horizontal dimension as viewed in FIG. 9) of 2 $\mu$m or more. As a result, as shown in FIGS. 8 and 9, some of the hillocks 3a may become long enough to cross the space between the wiring portion 3 and the adjacent wiring portion 4, causing short-circuiting between wiring portions 3 and 4.

With a conventional integrated circuit semiconductor device, it is necessary to provide a space of 2 $\mu$m or more between edge portions of a wide wiring portion which acts as a power line or ground line and an adjacent wiring portion in order to prevent the occurrence of short-circuiting. It has therefore been difficult to achieve high density wiring layers in integrated circuits and, hence, to achieve a high integration density.

SUMMARY OF THE INVENTION

The present invention has been accomplished to solve the above-stated problems, and an object of the present invention is to provide a wiring arrangement for integrated circuits, which is free from short-circuiting between wiring portions due to the formation of hillocks, and which thus has a high degree of reliability while also having a high integration density.

According to the present invention, there is provided a wiring arrangement for a semiconductor device with a high integration density comprising: a semiconductor substrate; a first wiring portion formed on the semiconductor substrate; a second wiring portion formed on the semiconductor substrate at a location adjacent to one edge of the first wiring portion; and short-circuiting prevention means formed in the first wiring portion for preventing short-circuiting between the first and second wiring portions through parts of edges of the first wiring portion which have expanded during heat treatment of the device.

The short-circuiting prevention means may comprise a groove formed in the first wiring portion in the vicinity of the edge thereof that is closer to the second wiring portion and that extends along the edge of the first wiring portion. The short-circuiting prevention means may comprise a plurality of indentations formed in the edge of the first wiring portion that is closer to the second wiring portion.

By virtue of the provision of the groove or the plurality of indentations, the wide first wiring portion is provided at the edge that is closer to the adjacent wiring portion with a structure which is functionally the same as a narrow wiring portion. More specifically, if a groove is formed to extend along the edge of the wide wiring portion, a narrow wiring part is effectively formed on the side of the wide wiring portion that is closer to the adjacent wiring portion. If a plurality of indentations are instead formed in the edge of the wide wiring portion, a plurality of thin wiring parts will be formed on the side of the wide wiring portion that is closer to the adjacent wiring portion.

Since it has been confirmed, as mentioned before, that substantially no hillocks are formed on a narrow wiring portion having a width of 2 μm or less, by forming a groove or a plurality of indentations and thus providing the edge of the wide wiring portion with a structure which is virtually the same as a narrow wiring portion, it is possible to prevent any hillocks from being formed on the wide wiring portion. Thus, it becomes possible to narrow the space between the wide wiring portion and the adjacent wiring portion while eliminating the risk of short-circuiting between these wiring portions being caused through the hillocks and preventing any degradation in the reliability of the semiconductor device. Thus, the wiring pattern can be formed with a high density.

DESCRIPTION OF THE PREFERRED EMBODIMENTS

The preferred embodiments of the present invention will now be described with reference to the accompanying drawings.

Figure 1:
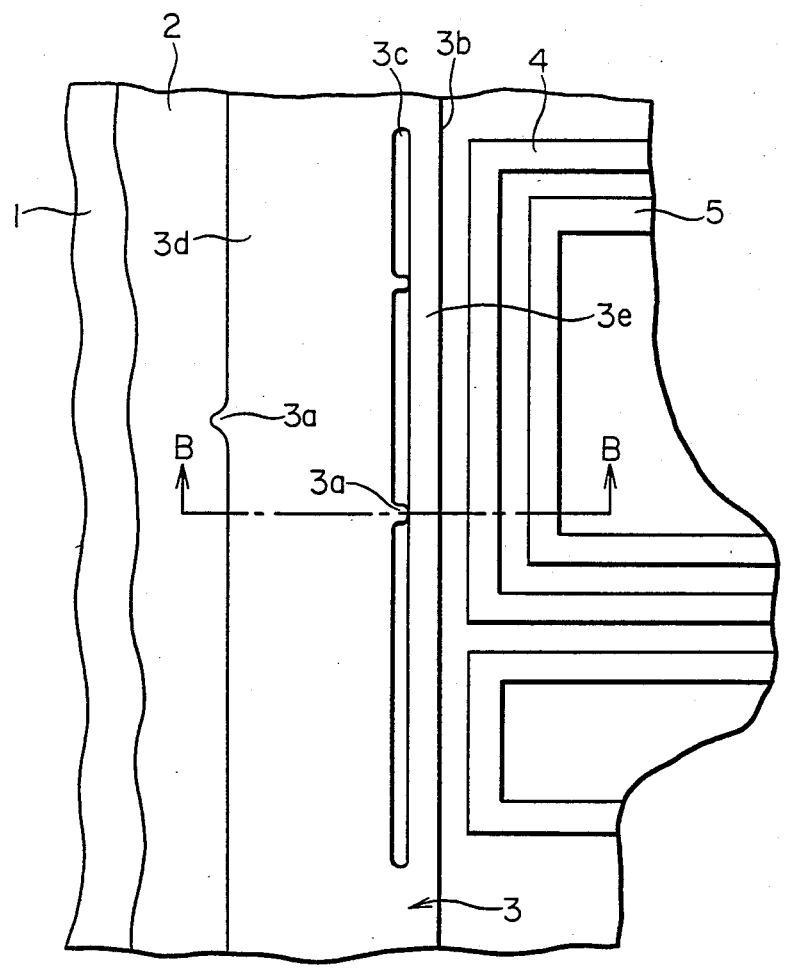
FIG. 1 is a fragmentary plan view of a wiring arrangement in accordance with a first embodiment of the present invention.
Figure 2:
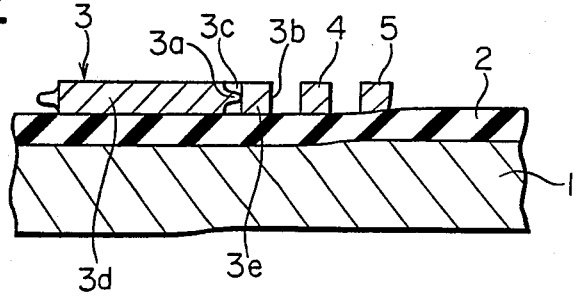
FIG. 2 is a sectional view taken along the line B—B shown in FIG. 1.

FIG. 1 is a fragmentary plan view of a wiring arrangement for a semiconductor integrated circuit in accordance with a first embodiment of the present invention, and FIG. 2 is a sectional view taken along the line B—B shown in FIG. 1. In these figures, the semiconductor device has a semiconductor substrate 1 on which circuit elements, such as transistors, capacitors, and resistors (none of which are shown), are formed. The semiconductor device further has an insulating film 2 which is formed over these circuit elements and wiring portions 3 to 5 which are formed on the insulating film 2. These wiring portions 3 to 5 are formed of a metal such as an aluminum alloy. The wiring portion 3 is a wide wiring portion which has a width of 5 μm or more and acts as a power line or ground line, while the wiring portions 4 and 5 are narrow wiring portions which each have a width of 2 μm or less and act as lines enabling connection between the circuit elements.

Figure 3:
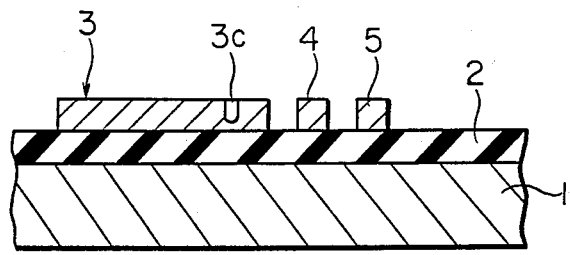
FIG. 3 is a fragmentary sectional view of a wiring arrangement in accordance with a modification of the first embodiment of the present invention.

A segment of one edge 3b of the wiring portion 3 is adjacent to the wiring portion 4 and is disposed parallel thereto. According to this embodiment, a groove 3c is formed in the wiring portion 3 in the vicinity of the segment of the edge 3b. As shown in FIG. 1, this groove 3c is formed parallel to the edge 3b of the wiring portion 3 and to be spaced therefrom by a distance of 2 μm or less. Further, as shown in FIG. 3, this groove 3c penetrates from the upper surface of the wide wiring portion 3 to the lower surface of the same. By virtue of the formation of this groove 3c in the wiring portion 3, the wiring portion 3 is divided into two parts, a wide part 3d and a narrow part 3e.

Therefore, when the semiconductor device, as described above, is subjected to a heat treatment such as annealing, hillocks 3a are formed only on a side edge of the wide part 3d of the wiring portion 3. More specifically, no hillocks are formed on the segment of the side edge 3b along one side edge of the narrow part 3e, and, instead, any hillocks 3a that are formed are located within the groove 3c, as shown in FIG. 1. This feature of this embodiment enables reduction of the space between the wide wiring portion 3 and the adjacent wiring portion 4 to a value of 2 μm or less, thus allowing the wiring pattern to be formed with a high density.

Even in the event that the tips of any of the hillocks 3a, which have formed during annealing, extend within the groove 3c from the wide part 3d of the wiring portion 3 to come into contact with the narrow part 3e, no problems will arise because the narrow part 3e and the wide part 3d are all parts of the wiring portion 3. Since the groove 3c is formed solely to prevent the material (aluminum alloy) which forms the wiring from displacing toward the edge 3b of the wiring portion 3 after the material has been softened during annealing, the width of the groove 3c may be much smaller than the width of the narrowest wiring portion in an ordinary wiring pattern. Accordingly, the formation of the groove 3c in the wiring portion 3 causes only a very small fraction of the total area of the wiring portion 3 to be lost.

The groove 3c of the wiring portion 3 need not penetrate this wiring portion 3 from the upper surface to the lower surface and, instead as shown in FIG. 3, may be in the form of a recess opening into only one of the upper and lower surfaces of the wiring portion 3.

Figure 5:
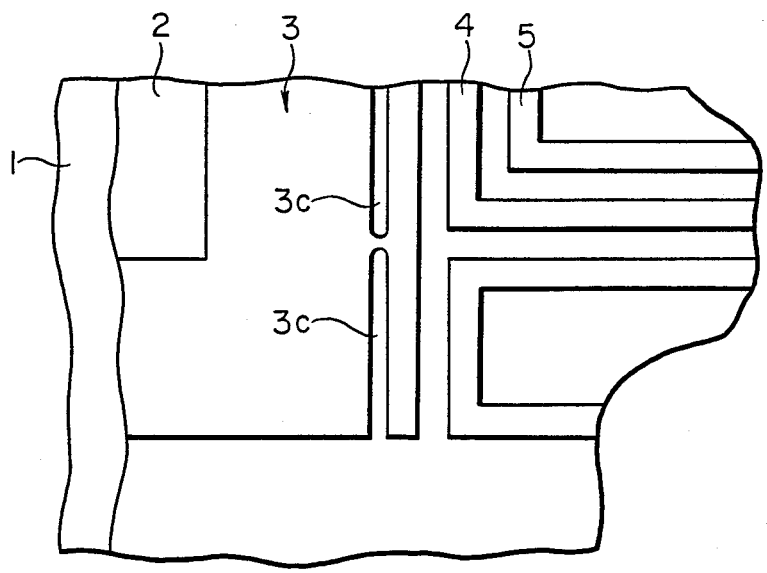
FIGS. 4 and 5 are fragmentary plan views of wiring arrangement in accordance with other modifications of the first embodiment of the present invention.
Figure 4:
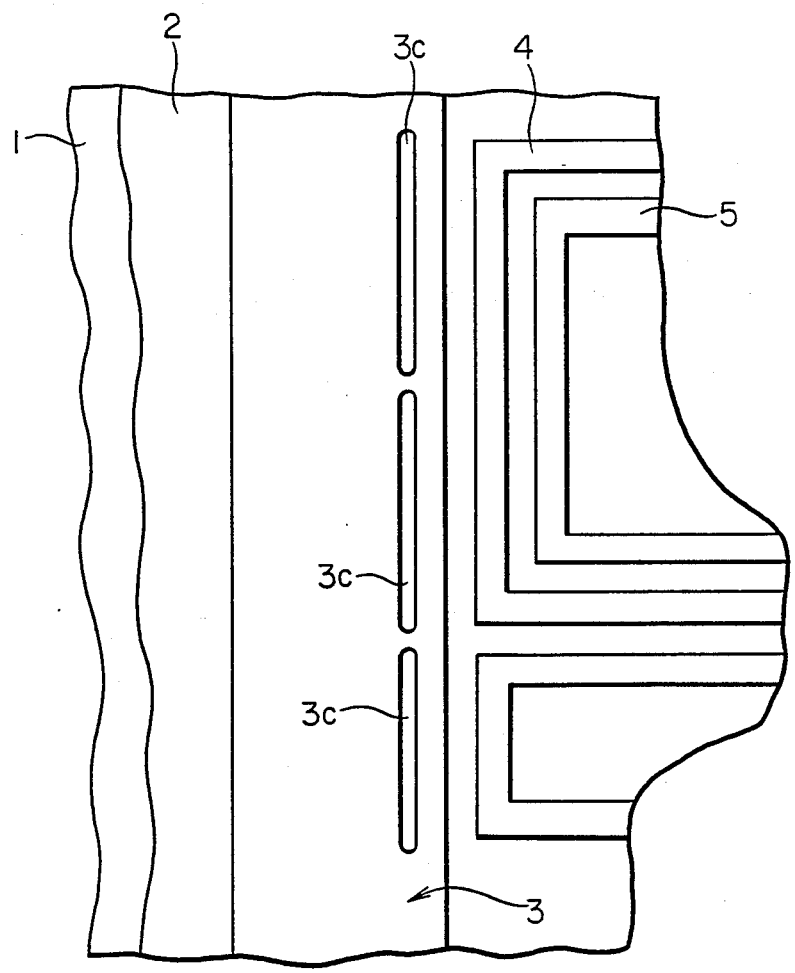

Further, the groove 3c, which is formed in the region of the wiring portion 3 that is adjacent to the wiring portion 4, as described before, need not be provided as a single continuous groove that extends along the length required. Instead, as shown in FIG. 4, it may be provided as a groove having a plurality of groove sections 3c which are formed by dividing the groove into sections longitudinally. With this arrangement, as shown in FIG. 5, a part of the groove sections 3c may open at one end into an end of the wiring portion 3.

Figure 6:
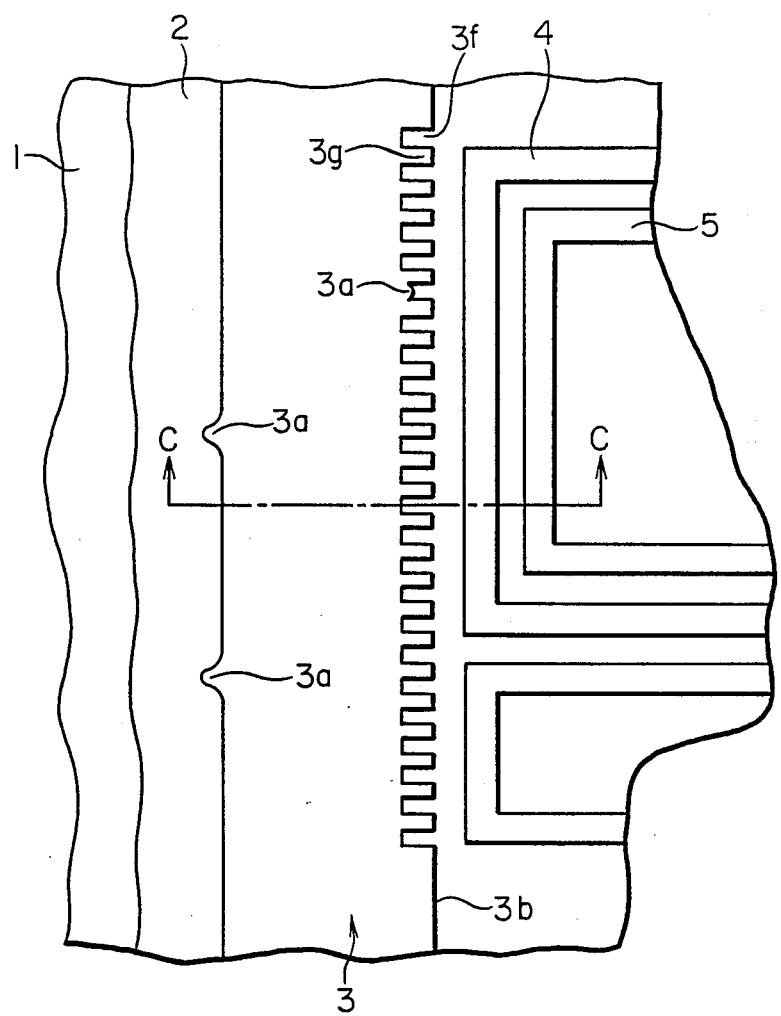
FIG. 6 is a fragmentary plan view of a wiring arrangement in accordance with a second embodiment of the present invention.
Figure 7:
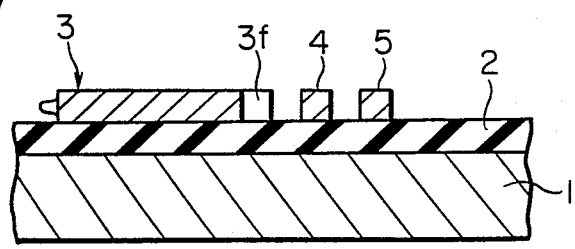
FIG. 7 is a sectional view taken along the line C—C shown in FIG. 6.
Figure 8:
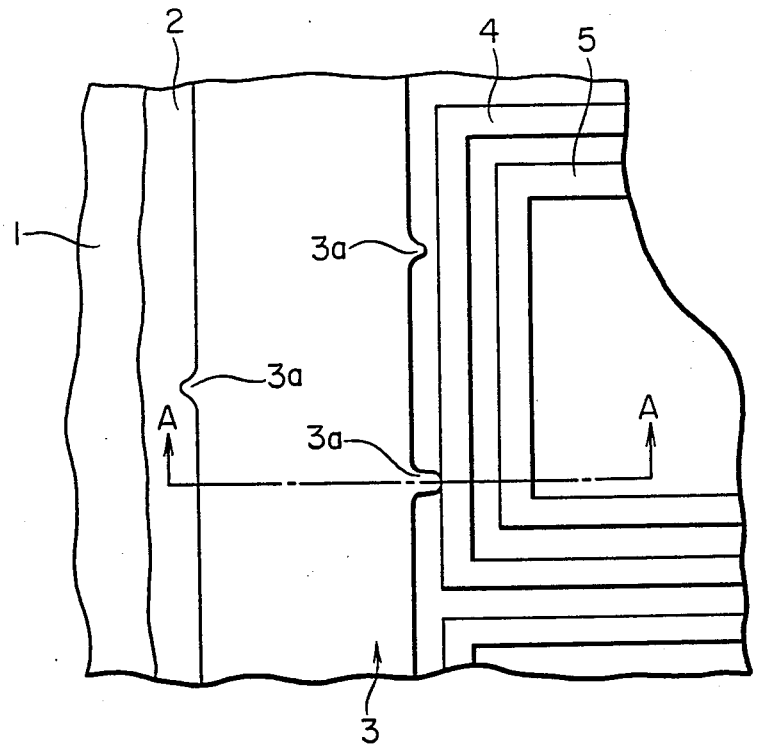
FIG. 8 is a fragmentary plan view of a conventional integrated circuit wiring arrangement.
Figure 9:
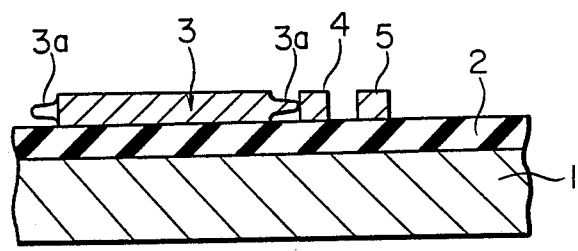
FIG. 9 is a sectional view taken along the line A—A shown in FIG. 8.

FIGS. 6 and 7 show a second embodiment of the present invention. According to this embodiment, a plurality of indentations 3f, which are parallel to each other, are formed in the wiring portion 3 in the segment of the edge 3b that is adjacent to the wiring portion 4. Each of the indentations extends normally with respect to the edge 3b of the wiring portion 3.

The provision of these indentations 3f provides, in turn, a plurality of thin wiring parts 3g, which are each normal to the side edge 3b of the wiring portion 3, on the side of the wiring portion 3 that is closer to the adjacent wiring portion 4. The arrangement of these indentations 3f and thin wiring portions 3g is such that the interval between two adjacent indentations 3f, in other words, the width of each of the thin wiring parts 3g, is 2 μm or less.

By virtue of this arrangement, substantially no hillocks are formed on the side edges of the thin wiring parts 3g during heat treatment such as annealing. Even if a hillock 3a is formed at the base between two adjacent thin wiring parts 3g, as shown in FIG. 6, this hillock 3a is held between these wiring parts 3g and is thus prevented from projecting from the edge 3b of the wiring portion 3 toward the adjacent wiring portion 4. As a result, it becomes possible to reduce the space between the wide wiring portion 3 and the adjacent wiring portion 4 to a value of 2 μm or less.

Each of the indentations 3f of the wiring portion 3 may have a longitudinal dimension which is much smaller than the width of the narrowest wiring portion of an ordinary wiring pattern, this being similar to the arrangement of the groove 3c in accordance with the first embodiment. Further, the arrangement of each of these indentations 3f is such that it may penetrate from the upper surface of the wiring portion 3 through to the lower surface of the same, or it may be in the form of a recess opening into only one of these upper and lower surfaces.

Furthermore, each of the indentations 3f of the wiring portion 3 need not be normal with respect to the edge 3b of the wiring portion 3 and, instead, it may be formed at a suitable angle with respect to the edge 3b.

Japanese Patent Laid-Open No. 57-207353 proposes a wiring method in which a wide aluminum wiring portion has a mesh-like structure so that no regions having a large area will be formed. This proposal includes a disclosure concerning formation of indentations in a part of the wide aluminum wiring portion. This proposal is, however, directed to the prevention of formation of cracks in the surface protecting film formed on the surface of the wide aluminum wiring portion, and is therefore irrelevant to a space between a wide wiring portion and an adjacent wiring portion.

In contrast with this, the second embodiment of the present invention is directed to the prevention of the formation of hillocks on one edge of a wide wiring portion which is disposed close to an adjacent wiring portion. This embodiment provides a semiconductor device in which a plurality of small indentations are formed in the region concerned so that the total area of the wiring portion is not reduced to any excessive extent. Therefore, the second embodiment of the present invention is different form the above-described proposal in that it is a prerequisite of the second embodiment of the present invention that the wide wiring portion be disposed close to the adjacent wiring portion. The operation and effect of this second embodiment is totally irrelevant to whether or not a surface protecting film is formed on the surface of the wiring.

Accordingly, it should be noted that the technical concepts of the above-mentioned proposal and the second embodiment of the present invention are different, and that the features of the present invention would not be suggested by any parts of the above-mentioned disclosure.

As described above, according to the present invention, by virtue of the provision of a groove formed in the vicinity of the edge of a wide wiring portion that is closer to an adjacent wiring portion, or of a plurality of indentations formed in the edge, it becomes possible to prevent any hillocks from being formed on the edge of the wide wiring portion that faces the adjacent wiring portion during heat treatment, such as annealing, of the semiconductor device. Therefore, the risk of short-circuiting occurring between these wiring portions can be prevented even when the space between the wide wiring portion and the adjacent wiring portion is narrowed. this enables the wiring pattern to be formed at high density, and thus ensures a high degree of reliability while also having a high integration density.

I claim:

1. A high density wiring arrangement for semiconductor devices comprising:
   a semiconductor substrate;
   a wiring level disposed on said substrate and including a first wiring portion having at least one edge and a second wiring portion opposite said edge; and
   means formed in said first wiring portion for preventing the formation of projections extending from said edge and short-circuiting said first and second wiring portions.

2. The wiring arrangement of claim 1 wherein said means comprises groove means formed in said first wiring portion in the vicinity of and spaced from said edge, said groove means extending along said edge.

3. The wiring arrangement of claim 2 wherein said groove means comprises a single groove extending continuously along said edge.

4. The wiring arrangement of claim 2 wherein said groove means comprises a plurality of grooves extending discontinuously along said edge.

5. The wiring arrangement of claim 2 wherein said groove means is spaced away from said edge by a distance of not more than 2 μm.

6. The wiring arrangement of claim 5 wherein said groove means penetrates through said first wiring portion.

7. The wiring arrangement of claim 5 wherein said groove means comprises a recess in said first wiring portion.

8. The wiring arrangement of claim 1 wherein said first and second wiring portions are metal.

9. The wiring arrangement of claim 8 wherein said metal is an aluminum alloy.

10. The wiring arrangement of claim 1 wherein said first wiring portion has a width of at least 5 μm.

11. The wiring arrangement of claim 4 wherein at least one of said plurality of grooves is open at one end thereof.

12. The wiring arrangement of claim 1 wherein said short-circuiting prevention means comprises a plurality of indentations formed in said edge.

13. The wiring arrangement of claim 12 wherein said indentations are spaced at intervals of not more than 2 μm along said edge.

14. The wiring arrangement of claim 13 wherein said indentations penetrate through said first wiring portion.

15. The wiring arrangement of claim 13 wherein said indentations comprise recesses in said first wiring portion.

* * * * *